United States Patent [19]

Falk

[11] Patent Number: 5,554,882

[45] Date of Patent: Sep. 10, 1996

[54] INTEGRATED TRIGGER INJECTOR FOR AVALANCHE SEMICONDUCTOR SWITCH DEVICES

[75] Inventor: R. Aaron Falk, Renton, Wash.

[73] Assignee: The Boeing Company, Seattle, Wash.

[21] Appl. No.: 404,128

[22] Filed: Mar. 14, 1995

Related U.S. Application Data

[63] Continuation of Ser. No. 147,300, Nov. 5, 1993, abandoned.

[51] Int. Cl.$^6$ .................. H01L 29/868; H01L 29/87
[52] U.S. Cl. .................. 257/605; 257/606; 257/656
[58] Field of Search .................. 257/603–606, 257/6–8, 113, 142, 656 R

[56] References Cited

U.S. PATENT DOCUMENTS

| | | | |
|---|---|---|---|
| 4,037,244 | 7/1977 | de Cremoux | 357/30 |
| 4,438,331 | 3/1984 | Davis | 250/211 |
| 4,525,732 | 6/1985 | Bayraktaroglu | 257/604 |
| 4,782,222 | 11/1988 | Ragle | 250/211 |
| 4,803,695 | 2/1989 | Yamamoto et al. | 372/92 |
| 4,806,997 | 2/1989 | Simmons et al. | 257/113 |
| 4,864,119 | 9/1989 | Ragle et al. | 250/211 R |
| 4,891,815 | 1/1990 | Ragle et al. | 357/44 |
| 4,894,526 | 1/1990 | Bethea et al. | 250/211 R |
| 5,023,685 | 6/1991 | Bethea et al. | 357/30 |
| 5,028,971 | 7/1991 | Kim et al. | 357/30 |
| 5,049,965 | 9/1991 | Schulze et al. | 257/113 |
| 5,150,185 | 9/1992 | Yamada | 257/8 |

FOREIGN PATENT DOCUMENTS

| | | | |
|---|---|---|---|
| 0148065 | 7/1985 | European Pat. Off. | 257/656 |
| 2151397 | 7/1985 | United Kingdom | 257/656 |

*Primary Examiner*—Peter Toby Brown
*Attorney, Agent, or Firm*—Foley & Lardner

[57] ABSTRACT

An avalanche semiconductor switch device utilizes trigger input. The integrated trigger input is a charge carrier injector which injects charge carriers directly into the avalanche semiconductor switch device. The avalanche semiconductor switch device includes: an active, semi-insulating layer; an anode; a cathode; and an injector disposed on the anode contact. The injector serves to switch the device into a state of very high conductance when a positive bias is applied to the injector. The integrated trigger input allows low power optical sources to be used with the avalanche semiconductor switch device further back in the trigger chain. The injector may inject holes or electrons. The injector may be integrated on one side of the substrate.

11 Claims, 3 Drawing Sheets

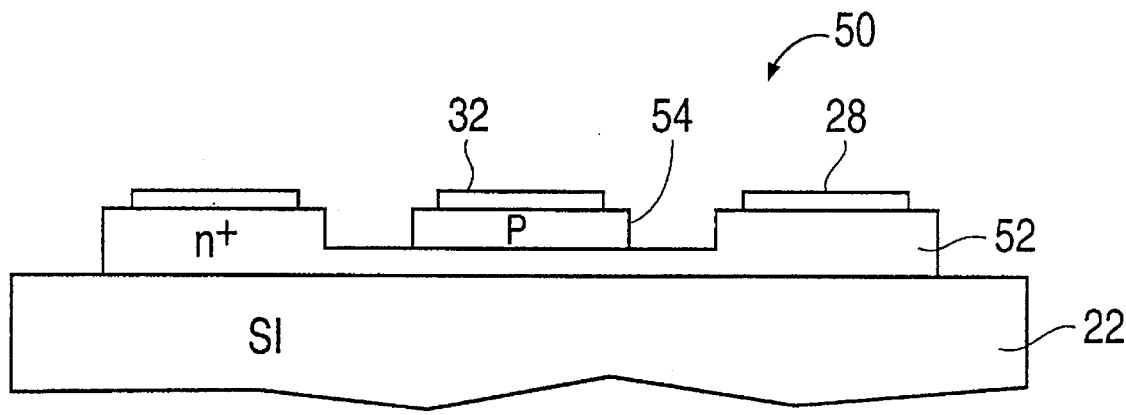
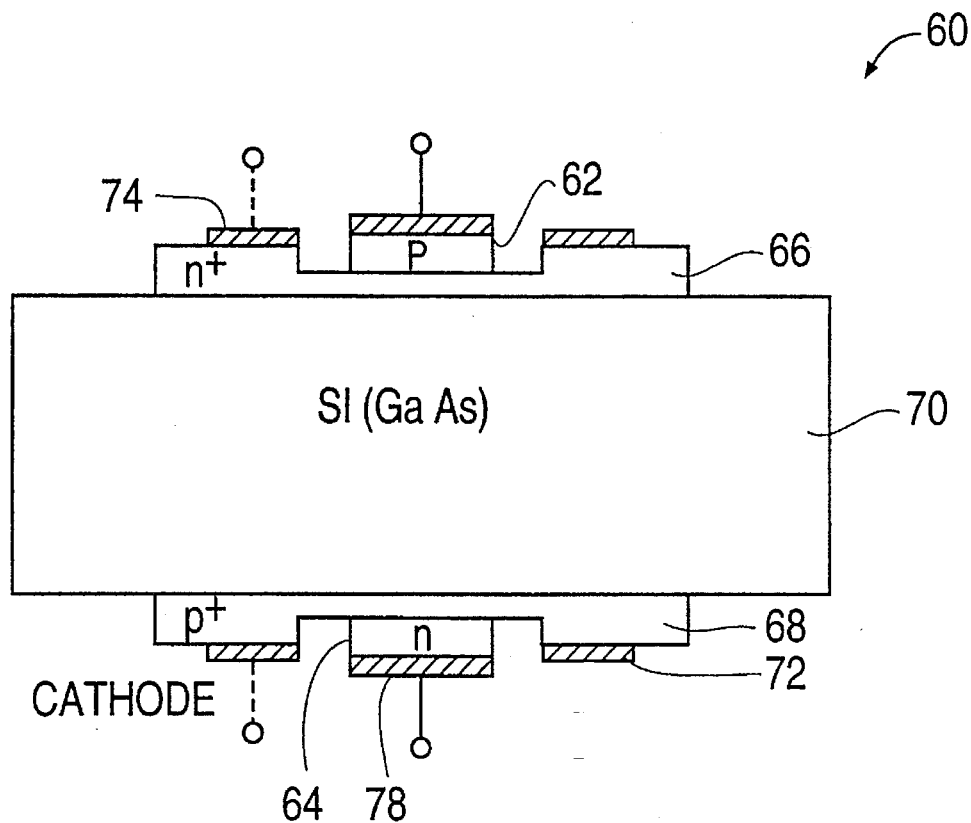

5,554,882

1

INTEGRATED TRIGGER INJECTOR FOR AVALANCHE SEMICONDUCTOR SWITCH DEVICES

This application is a continuation of application Ser. No. 08/147,300, filed Nov. 5, 1993.

BACKGROUND OF THE INVENTION

The invention is directed to avalanche semiconductor switch devices. More specifically, the invention is directed to techniques for integrating device triggers into a solid state or semiconductor device such as a BASS (Bulk Avalanche Semiconductor Switch) device or a surface avalanche semiconductor switch device.

An avalanche semiconductor switch device is generally utilized as an optically triggered switch. A typical avalanche semiconductor switch device comprises a doped semiconductor material between two electrical contacts.

An avalanche semiconductor switch device may consist of two electrodes of about one square millimeter area on each side of a one millimeter thick GaAs substrate. The avalanche semiconductor switch device generally operates as a switch which is optically triggered. When a bias voltage is applied across the electrodes or contacts, the avalanche semiconductor switch device conducts in response to an intense pulse of light. For example, if the bias voltage is above a threshold value, typically in the range of 3–5 kV, and the optical energy from the light is also above a threshold value, typically 1–2 nJ in a few nsec, the avalanche semiconductor switch device enters a state of very high conductance.

When the light is above the threshold value, photoconductors are generated in the avalanche semiconductor switch. The photoconductors cause charge carriers (i.e., electrons and holes) to collide with atoms, knocking lose electron-hole pairs, which in turn creates additional electron-hole pairs, thereby creating an exponentially increasing current level in the avalanche semiconductor switch device. This exponential increase of current flow is known as avalanche breakdown. Thus, the avalanche semiconductor switch device operates as a switch which reaches very high conductance in response to being optically injected.

Heretofore, avalanche semiconductor switch devices are generally utilized in applications which optically isolate the input and the output. However, the avalanche semiconductor switch device generally requires the use of a high power light source to provide a high power optical input (intense pulse of light) to the avalanche semiconductor switch device. The high power output is generally over 10 Watts peak power which is provided by expensive laser diodes and drivers with expensive handbuilt optical interfaces. Thus, there is a need in the art to provide an integrated device trigger for injecting charge carriers directly into the avalanche semiconductor switch device.

SUMMARY OF THE INVENTION

It is therefore an object of the instant invention to integrate a carrier injector directly into the avalanche semiconductor switch-type device. Optical isolation of the input and output may be implemented by providing a low power optical output further back in the trigger chain where cheap, low-power light sources can be used.

The present invention relates to an avalanche semiconductor switch device. According to a first aspect of the present invention, the avalanche semiconductor switch

2 device includes a semi-insulating layer, a first layer, and an injector layer. The first layer is coupled to the semi-insulating layer. The injector layer is integrated on the first layer. The injector layer injects charges into the semi-insulating layer.

According to a second aspect of the present invention, the avalanche semiconductor switch device includes a first layer, a second layer, a semi-insulating layer, and an injector means. The first layer has a metal anode, and the second layer has a metal cathode. The semi-insulating layer is coupled to the first layer and the second layer. The injector means is integrated on to the avalanche semiconductor switch device for providing charge carriers to the semi-insulating layer.

The present invention may also relate to an avalanche semiconductor switch device having an annular or ring anode.

It is a further object of the present invention to provide an integrated trigger input which requires less hands-on fabrication in order to reduce manufacturing costs. Other objects, features, and advantages of the invention will be apparent from the following description of the preferred embodiments.

BRIEF DESCRIPTION OF THE DRAWINGS

The invention will be described in further detail with reference to the accompanying drawings, wherein like designators indicate like elements. The features of the invention which are believed to be novel are set forth with particularity in the appended claims. The invention, together with the further objects and advantages thereof, may be best understood by making reference to the following description taken in conjunction with the accompanying drawings, wherein:

FIG. 3 illustrates a side view of another preferred exemplary embodiment of the avalanche semiconductor switch device with a thin $n^+$ layer in accordance with the present invention;

FIG. 4 illustrates a side view of yet another preferred exemplary embodiment of the avalanche semiconductor switch device with an integrated hole injector and an integrated electron injector in accordance with the present invention.

DETAILED DESCRIPTION OF THE PREFERRED EMBODIMENTS

Figure 1:
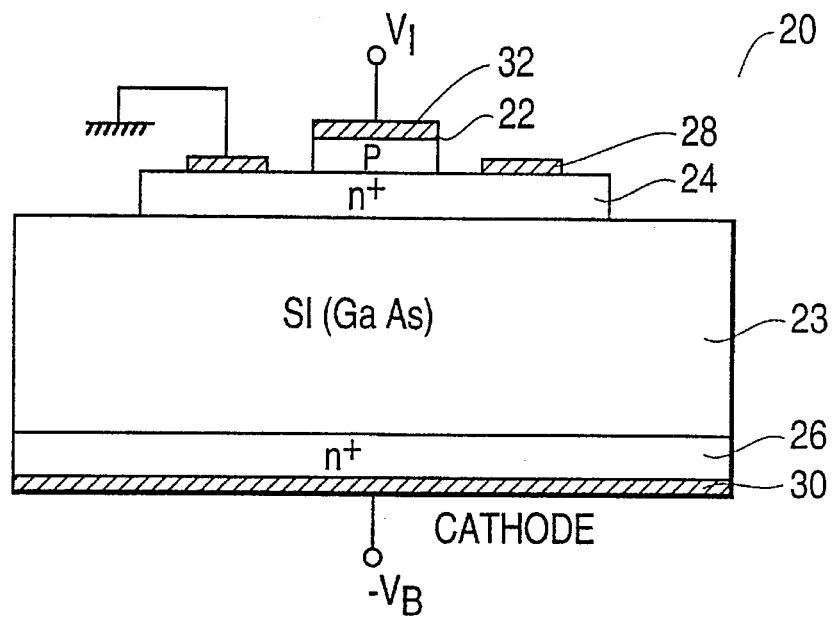
FIG. 1 illustrates a side view of a preferred exemplary embodiment of the avalanche semiconductor switch device with an integrated hole injector in accordance with the present invention.

With reference to FIG. 1, an avalanche semiconductor switch device 20 with an integrated hole injector 22 in accordance with a preferred exemplary embodiment of the present invention is shown. The avalanche semiconductor switch device 20 includes a semi-insulating (SI) layer 23 located in between a layer 24 and a layer 26. The layers 24 and 26 may be epitaxial (epi) layers and are preferably highly doped $n^+$ layers. The layer 23 is preferably SI GaAs. The dopants in the layer 23 are adjusted to provide a highly resistant layer. The layers 24 and 26 have a high density of dopants in order to provide low resistance contacts to the SI layer.

Figure 2:
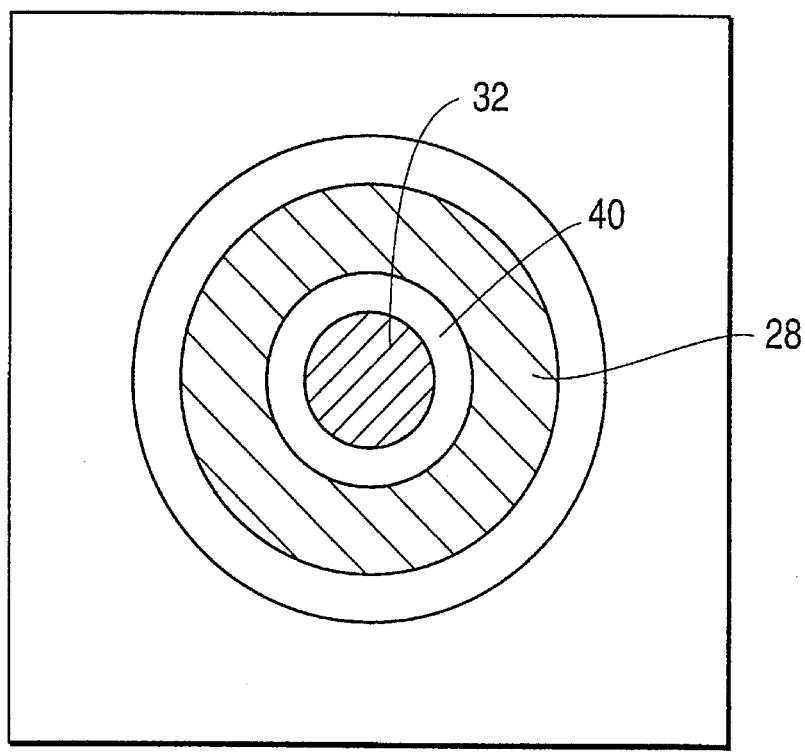
FIG. 2 illustrates a top view of the avalanche semiconductor switch device shown in FIG. 1.

The layers 24 and 26 provide a metal $n^+$ type contact on both sides of the layer 23. With reference to FIG. 2, an annular metal anode contact 28 is coupled to the layer 24. A metal cathode contact 30 is coupled to the layer 26. A metal circular contact 32 is coupled to the injector 22. The injector 22 is coupled to the layer 24.

The hole injector 22 is preferably added to the layer 24. The hole injector 22 and the layer 24 preferably form a diode which in the forward bias direction can inject charge carriers into the SI layer 22 of the avalanche semiconductor switch device 20. Preferably, the hole injector 22 is a p layer.

When a positive bias $V_I$ applied to the contact 32, holes are injected into the layer 24. Many of these holes are diffused into the SI layer 22, where they are pulled toward the cathode contact 30. Hence, these holes serve as the initiator of the avalanche semiconductor switch device 20 switching to a conductive state.

Fairly thick $n^+$ layers 24 and 26, approximately 5 µm, may be used on the avalanche semiconductor switch device 20 to allow large currents 24 and 26 to flow without pinch points. With reference to FIG. 3, an avalanche semiconductor switch device 50 in accordance with another preferred exemplary embodiment of the present invention includes a thin layer 52. The thin layer 52 allows the avalanche semiconductor switch device 50 to provide more optimal injection from a hole injector 54. The layer 52 is preferably a thin $n^+$ layer. The layer 52 may be thinned to less than 0.1 µm.

The thin $n^+$ layer 52 may be provided by back etching the $n^+$ layer where the hole injector 54 is placed, as shown in FIG. 3. Back etching provides a reasonable compromise between the pinch point restraint and optical injection. Back etching does not compromise the operation of the avalanche semiconductor switch device 50.

With reference to FIG. 4, another preferred exemplary embodiment of an avalanche semiconductor switch device 60 includes an integrated hole injector 62 and an integrated electron injector 64. The hole injector 62 is coupled to layer 66. The electron injector 64 is coupled to layer 68. An SI layer 70 is located between layers 66 and 68. Preferably, the hole injector 62 is a p layer and the layer 66 is an $n^+$ layer which is thin at the location of the hole injector 62. Preferably, the electron injector 64 is an n layer, and the layer 68 is a $p^+$ layer, which is thin at the location of the electron injector 64.

A metal cathode contact 72 is coupled to the layer 68, and a metal annular contact 74 is coupled to the layer 66. A contact 76 is coupled to the hole injector 72, and a contact 78 is coupled to the electron injector 64.

The injection of holes into the avalanche semiconductor switch device 60 is accomplished in the same way as the injection of holes into the avalanche semiconductor switch device 20 discussed with reference to FIG. 1. The injection of electrons is accomplished at the contact 72 by reversing the layering structure of the hole injector 62 and layer 66. When a positive bias is applied from the cathode contact 72 to the contact 78, electrons are injected into the layer 68 and diffuse into the SI layer 70.

The avalanche semiconductor switch devices 20, 50 and 60 do not directly emulate an optical input. Specifically, an optical input allows rapid injection, i.e., faster than the carrier velocity, of equal numbers of holes and electrons into a large volume. This property of optical injection may not be essential. Nonetheless, the avalanche semiconductor switch devices 20, 50 and 60 may be modified in order to obtain the properties of optical injection. For example, the dopant profile of the hole injector 62 may be modified to allow large amount of electron-hole recombination, thereby forming an LED (Light Emitting Diode).

Figure 5:
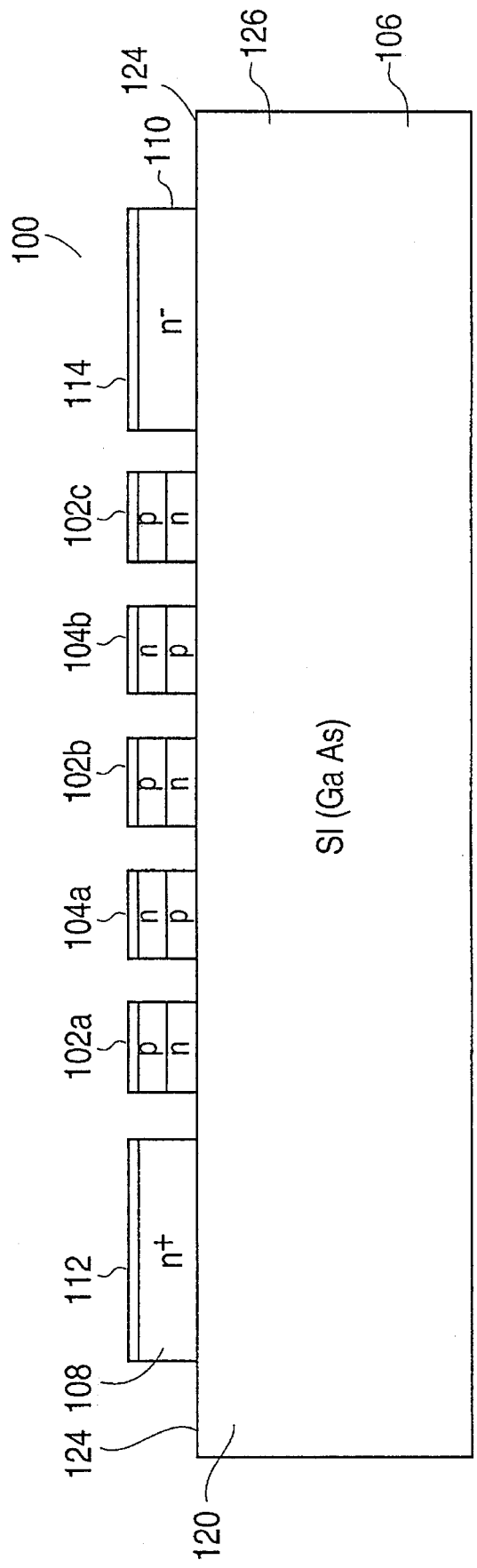
FIG. 5 illustrates a side view of still another preferred exemplary embodiment of an avalanche semiconductor switch device with multiple hole and electron injectors in accordance with the present invention.

With reference to FIG. 5, a side view of an avalanche semiconductor switch device 100 is shown with multiple hole injectors 102 A–C and multiple electron injectors 104 A–B in accordance with still another preferred exemplary embodiment of the present invention. An SI layer 106 is coupled to a $n^+$ layer 108 and a $n^-$ layer 110. The $n^+$ layer 108 is coupled to a metal anode contact 112, and the $n^-$ layer 110 is coupled to a metal cathode contact 114. The contact 112 is located on an end 120 of a first side 124 of the SI layer 106, and the contact 114 is located at an end 126 of the first side 124 of the SI layer 106. The hole injectors 102 A–C and the electron injectors 104 A–B are located between the metal anode contact 112 and the metal cathode contact 114.

The avalanche semiconductor switch device 100 is a surface device which allows injection directly between the $n^+$ layer 108 and the $n^-$ layer 110. This type of architecture permits effective tailoring of the injection profile of the avalanche semiconductor switch device 100 and less expensive manufacture of the avalanche semiconductor switch device 100.

Several of the geometry variations are clearly possible using the teachings of the present invention. An exchange of the relative position of the anode/cathode and injectors as well as various interdigitated structures are examples of such variations.

Other designs within the spirit and scope of the invention will be apparent to those skilled in the field after receiving the above teachings. The invention, therefore, is defined with reference to the following claims.

What is claimed is:

1. An avalanche semiconductor switch device, comprising:

a semi-insulating layer;

a first layer heavily doped with an n type dopant coupled to said semi-insulating layer, said first layer being integrated above and in contact with said semi-insulating layer, said first layer being integrated below and in contact with an anode contact;

an injector layer doped with a p type dopant integrated above and in contact with said first layer, said injector layer having a level of the p type dopant less than the level of the n type dopant in the first layer and capable of injecting charges into said semi-insulating layer in response to a voltage across said first layer and said injector layer; and a second layer heavily doped with the n type dopants being below and in contact with the semi-insulating layer, the second layer being above and in contact with a cathode contact.

2. The device as recited in claim 1 wherein said first layer is an $n^+$ layer having a thickness of approximately 5 µm.

3. The device as recited in claim 1, wherein said anode contact is above said first layer and adjacent to said injector layer.

4. The device as recited in claim 3 wherein said anode contact is a ring anode surrounding said injector layer.

5. The avalanche semiconductor switch device as recited in claim 1 wherein said semi-insulating layer is GaAs.

6. The device as recited in claim 1 wherein said injector layer is coupled to an injector metal contact and the charges are holes.

7. An avalanche semiconductor switch device, comprising:

a semi-insulating layer;

a first layer doped with an n type dopant coupled to said semi-insulating layer, said first layer being above and in contact with said semi-insulating layer, said first layer coupled to an anode contact;

an injector layer doped with a p type dopant integrated above and in contact with said first layer, said injector layer being doped with less p type dopants than the first layer is doped with the n type dopants, said injector layer capable of injecting charges into said semi-insulating layer in response to a voltage across said first layer and said injector layer, wherein said first layer is back etched to form a thin section and a thick section of said first layer, said thin section having a thickness less than a thickness of the thick section, said injector layer being integrated above and in contact with the thin section; and a second layer doped with the n type dopants below and in contact with the semi-insulating layer, the second layer being above and in contact with a cathode contact;

wherein the switch device reaches a very high conductive state between the anode contact and the cathode contact in response to a high voltage bias across the anode contact and the cathode contact and in response to the voltage across the first layer and the injector layer, whereby the charges from the injector layer are injected into the first layer and diffuse into the semi-insulating layer, thereby causing bulk avalanche breakdown in the semi-insulating layer.

8. The device as recited in claim 7 wherein the thin section is less than 0.1 µm thick.

9. An avalanche semiconductor switch device for use in high voltage applications, comprising:

a first epitaxial layer highly doped with a first type dopant, the first epitaxial layer having a top side and a bottom side;

an anode contact above and in contact with the top side of the first epitaxial layer;

a second epitaxial layer highly doped with the first type dopant, the second epitaxial Layer having a top side and a bottom side;

a semi-insulating layer, doped to provide a highly resistant layer, the semi-insulating layer having a top side and a bottom side, the top side of the semi-insulating layer being below and in contact with the bottom side of the first epitaxial layer and the bottom side of the semi-insulating layer being above and in contact with the top side of the second epitaxial layer, the semi-insulating layer being between the first and second epitaxial layers; and an injector layer doped with a second type dopant, the injector layer having a top side and a bottom side, the bottom side of the injector layer being above and in contact with the top side of the first epitaxial layer, the injector layer having a level of the second type dopant less than the first type dopant in the first epitaxial layer wherein the injector layer is capable of injecting charges into the semi-insulating layer through the first epitaxial layer in response to a voltage between the first epitaxial layer and the top side of the injector layer, wherein the switch device reaches a very high conductive state between the anode contact and a cathode contact in response to a high voltage bias across the anode contact and the cathode contact and in response to the voltage across the first layer and the injector layer, whereby the charges from the injector layer are injected into the first layer and diffuse into the semi-insulating layer, thereby causing bulk avalanche breakdown in the semi-insulating layer.

10. The switch of claim 9, wherein the first and second epitaxial layers are each approximately 5.0 micrometers thick.

11. The switch as recited in claim 10, wherein the first type dopant is an n type dopant and the second type dopant is a p type dopant.

* * * * *